(12) United States Patent
Senda

(10) Patent No.: US 6,927,620 B2
(45) Date of Patent: Aug. 9, 2005

(54) SEMICONDUCTOR DEVICE HAVING A BOOSTING CIRCUIT TO SUPPRESS CURRENT CONSUMPTION

(75) Inventor: Minoru Senda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/702,543

(22) Filed: Nov. 7, 2003

(65) Prior Publication Data

US 2004/0150463 A1 Aug. 5, 2004

(30) Foreign Application Priority Data

Jan. 30, 2003 (JP) ........................ 2003-021758

(51) Int. Cl.$^7$ .............. G05F 1/10; G05F 3/02
(52) U.S. Cl. ................................ 327/536
(58) Field of Search ................ 327/536, 589; 363/59–60

(56) References Cited

U.S. PATENT DOCUMENTS 6,195,307 B1 * 2/2001 Umezawa et al. ......... 365/226
6,259,612 B1   7/2001 Itoh ..................... 363/60

FOREIGN PATENT DOCUMENTS

| JP | 2001-95234 A | 4/2001 |
| JP | 2002-15571 A | 1/2002 |

* cited by examiner

*Primary Examiner*—Quan Tra
(74) *Attorney, Agent, or Firm*—McDermott Will & Emery LLP

(57) ABSTRACT

A semiconductor device includes a boosting circuit for supplying a power supply voltage during a standby state of the semiconductor device. The boosting circuit includes a charge pump circuit and first and second detection circuits for detecting an output voltage of the charge pump circuit. The second detection circuit is operated by a DC current greater than that of the first detection circuit, and is activated by an output (Vdet1) from the first detection circuit. The charge pump circuit is activated based on at least an output (Vdet2) from the second detection circuit.

7 Claims, 5 Drawing Sheets

SEMICONDUCTOR DEVICE HAVING A BOOSTING CIRCUIT TO SUPPRESS CURRENT CONSUMPTION

BACKGROUND OF THE INVENTION

1. Field of the Invention

The present invention relates to control of a boosting circuit which generates an internal power supply voltage in a semiconductor device.

2. Related Art

In a semiconductor device, a circuit for generating a desired voltage in the semiconductor device, a charge pump circuit is known. A semiconductor device such as a FLASH MEMORY includes two internal voltage generation circuits which operate in a normal operation state and a standby state to reduce a standby current.

An internal voltage generation circuit in the semiconductor device is for example disclosed in Reference 1* and Reference 2**. These patent documents disclose a boosting circuit comprising a charge pump circuit and a circuit for detecting an output voltage of the charge pump circuit to control an operation of the charge pump based on the detected output voltage. More specifically, the following technique is disclosed. That is, the boosting circuit detects an output voltage Vpp of the charge pump circuit, compares the output voltage Vpp with a reference voltage, activates the charge pump circuit when the output voltage Vpp is lower than the reference voltage, and inactivates the charge pump circuit when the output voltage Vpp reaches the reference voltage.

In the above boosting circuit, in order to reduce a current consumption in a standby state of the semiconductor device, it can be considered to reduce a DC current flowing in a circuit for controlling the operation of a charge pump circuit based on the output voltage of the charge pump in the standby state.

However, the response of the circuit is deteriorated when the DC current is reduced, resulting in a practical problem. In the standby state, while a rate of voltage drop caused by a leakage current or the like of a transistor in the semiconductor device is very low, the boosting rate of the voltage by the charge pump is considerably higher than that of the rate of voltage drop by the leakage current. For this reason, the low response of the boosting circuit also boosts a high voltage in the operation of the charge pump circuit, resulting in a large amount of ripple of a power supply voltage.

(References)

* Reference 1: Japanese Patent Laid-Open Publication No. 2001-95234 (see, for example, Paragraph [0007], FIGS. 12 and 13

** Reference 2: Japanese Patent Laid-Open Publication No. 2002-15571 (see, for example, FIGS. 1 to 3, Paragraphs [0043] and [0044])

SUMMARY OF THE INVENTION

The present invention is directed to solve the above problem, and has as its object to provide a semiconductor device having a boosting circuit achieving a boosting operation with a small variation in voltage while suppressing a current consumption in a standby state.

A semiconductor device according to the present invention has a boosting circuit that supplies a power supply voltage during a standby state of the semiconductor device. The boosting circuit includes a charge pump circuit, a first detection circuit that detects an output voltage of the charge pump circuit, and a second detection circuit that detects the output voltage of the charge pump circuit, the second detection circuit operating with a DC current greater than that of the first detection circuit and being activated by a detection signal of the first detection circuit. The charge pump circuit is activated based on at least a detection signal of the second detection circuit.

According to the present invention, provided can be a boosting circuit which can supply an internal power supply voltage including a small amount of ripple with a reduced current consumption in a standby state in a semiconductor device.

DETAILED DESCRIPTION OF THE PREFERRED EMBODIMENTS

With reference to the accompanying drawings, preferred embodiments of a semiconductor device according to the present invention will be described below.

First Embodiment

Figure 1:
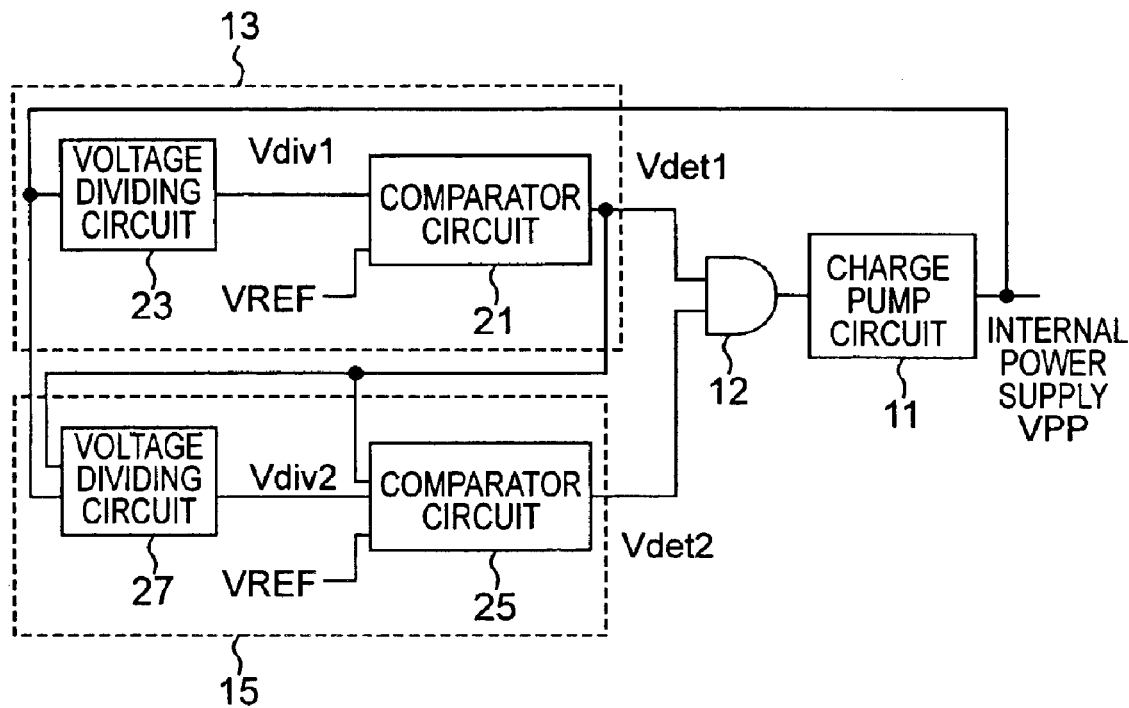
FIG. 1 is a diagram showing the configuration of a boosting circuit in a semiconductor device according to the first embodiment of the present invention.

FIG. 1 is a diagram showing the configuration of a boosting circuit included in a semiconductor device according to the present invention. This boosting circuit is a circuit for generating an internal power supply voltage at a standby state of the semiconductor device, and outputs a voltage which is obtained by boosting a voltage supplied from external or a dropped voltage supplied from external. The boosting circuit includes a charge pump circuit 11 for supplying an internal power supply voltage of the semiconductor device, and first and second detection circuits 13 and 15 for detecting an output voltage from the charge pump circuit 11. The boosting circuit further includes an AND gate 12 for performing AND operation of outputs Vdet1 and Vdet2 from the first and second detection circuits 13 and 15. The charge pump circuit 11 is activated on the basis of the result of AND operation of outputs Vdet1 and Vdet2 of the first and second detection circuits 13 and 15. The second detection circuit 15 is activated by the output voltage Vdet1 of the first detection circuit 13.

Figure 2:
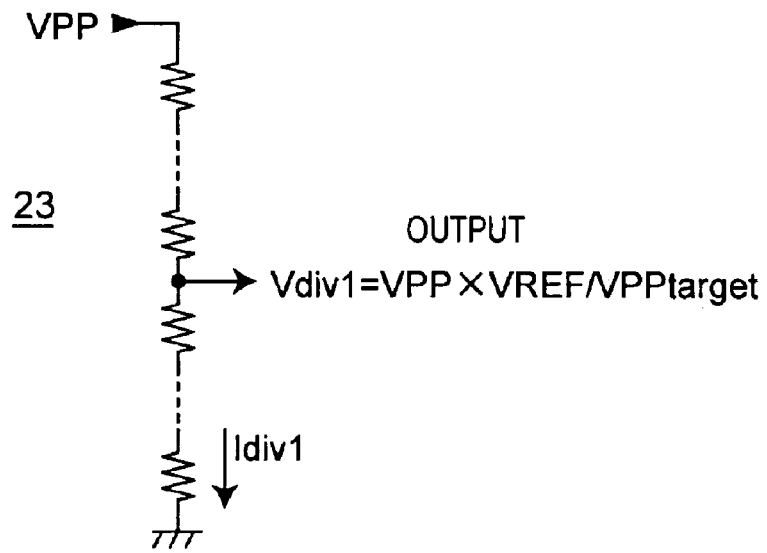
FIG. 2 is a diagram showing the configuration of a voltage dividing circuit in a first detection circuit of the boosting circuit.
Figure 3:
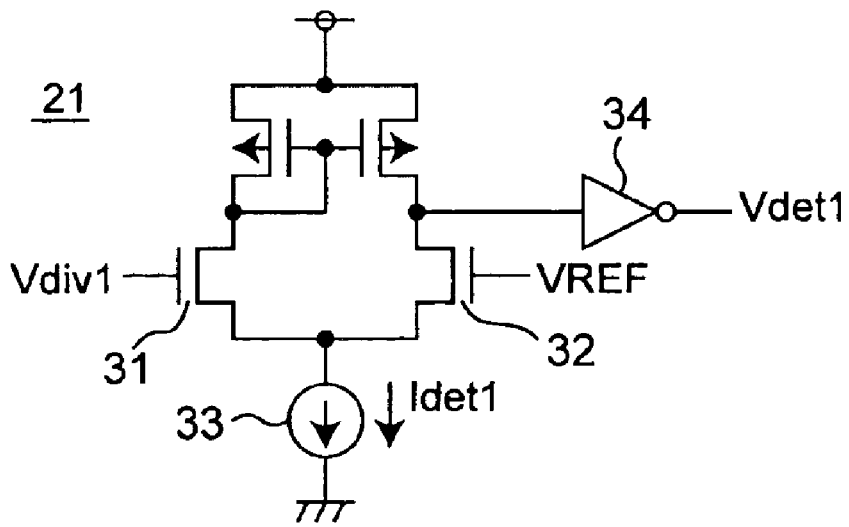
FIG. 3 is a diagram showing the configuration of a comparator circuit in the first detection circuit of the boosting circuit.

The first detection circuit 13 has a comparator circuit 21 and a voltage dividing circuit 23. The voltage dividing circuit 23 includes a plurality of resistors as shown in FIG. 2. The resistances of those resistors are determined such that an output Vdiv1 of the voltage dividing circuit 23 is equal to Vpp×VREF/Vpptarget, where, VREF denotes a reference voltage and is set to be a value corresponding to a target voltage Vpptarget of the charge pump circuit. The voltage Vpptarget is a target voltage used for operating the charge pump circuit. A DC current Idiv1 flows in the voltage dividing circuit 23. The comparator circuit 21 contains, as shown in FIG. 3, a current mirror circuit, transistors 31 and 32, a current source 33, and an inverter 34. A DC current Idet1 flows in the comparator circuit 21.

Figure 4:
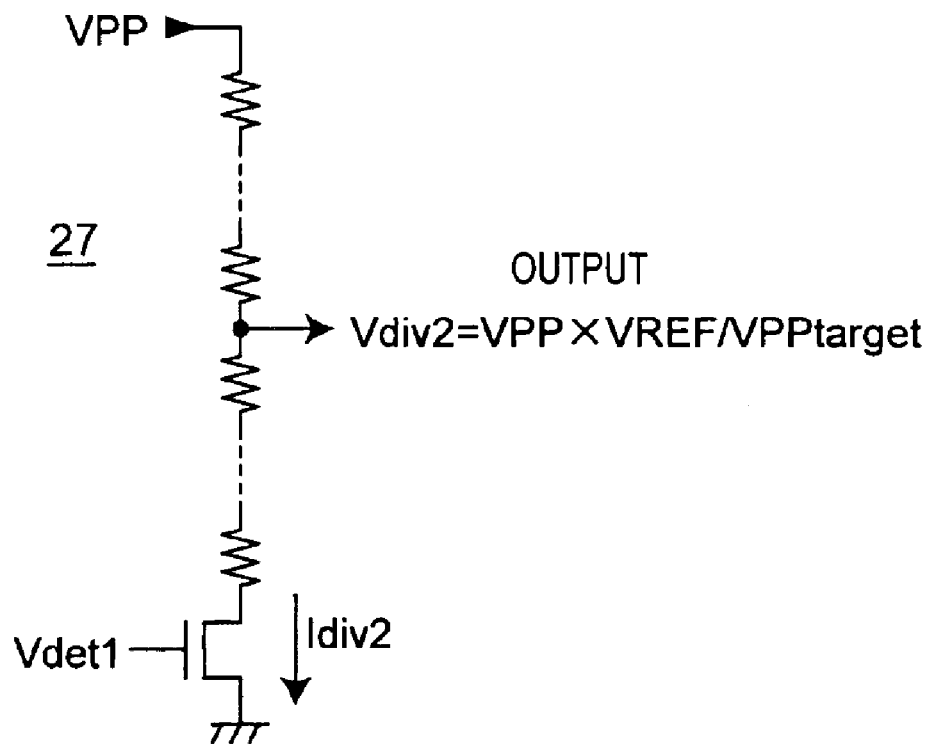
FIG. 4 is a diagram showing the configuration of a voltage dividing circuit in a second detection circuit of the boosting circuit (first embodiment).
Figure 5:
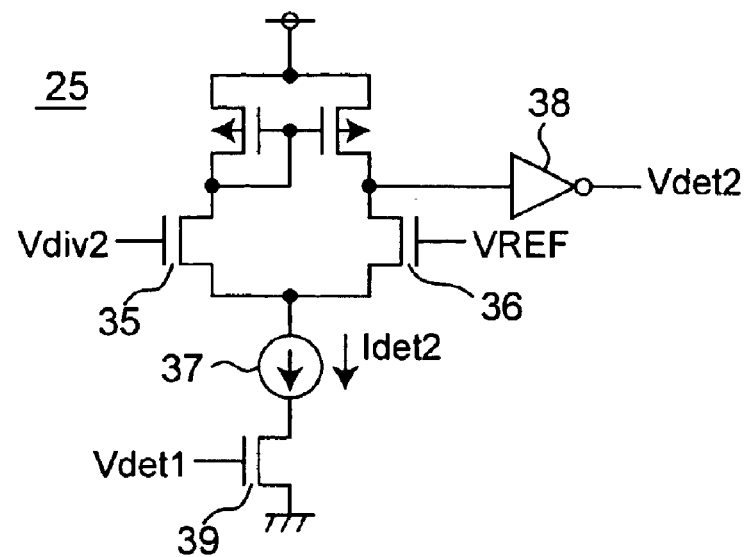
FIG. 5 is a diagram showing the configuration of a comparator circuit in the second detection circuit of the boosting circuit.

The second detection circuit 15 contains a comparator circuit 25 and a voltage dividing circuit 27. The voltage dividing circuit 27 includes, as shown in FIG. 4, a plurality of resistors. The resistances of those resistors are determined such that an output Vdiv2 of the voltage dividing circuit 27 is equal to Vpp×VREF/Vpptarget. The comparator circuit 25 contains, as shown in FIG. 5, a current mirror circuit, transistors 35 and 36, a current source 37, and an inverter 38. A DC current Idev2 which is larger than the DC current Idiv1 flows in the voltage dividing circuit 27, and a DC current Idet2 which is larger than the DC current Idet1 flows in the comparator circuit 25. Therefore, the second detection circuit 15 has a higher response than that of the first detection circuit 13.

The first detection circuit 13 inputs an output voltage Vpp from the charge pump circuit 11, and outputs a signal of "High" level when the output voltage Vpp is lower than the target voltage Vpptarget.

The second detection circuit 15 inputs the output voltage Vpp of the charge pump circuit 11. The second detection circuit 15 also inputs the output Vdet1 of the first detection circuit 13, and is activated when the output Vdet1 of the first detection circuit 13 is at "High" level. The second detection circuit 15 outputs a signal at "High" level, when the detected voltage Vpp is lower than the target voltage Vpptarget and the output Vdet1 of the first detection circuit 13 is at "High" level.

The charge pump circuit 11 performs an AND operation of the outputs Vdet1 and Vdet2 of the first and second detection circuits 13 and 15 to internally generate a pump enable signal, and is activated/inactivated by the pump enable signal. More specifically, the charge pump circuit 11 operates only when both the outputs of the first and second detection circuits 13 and 15 are at "High" level.

Figure 6:
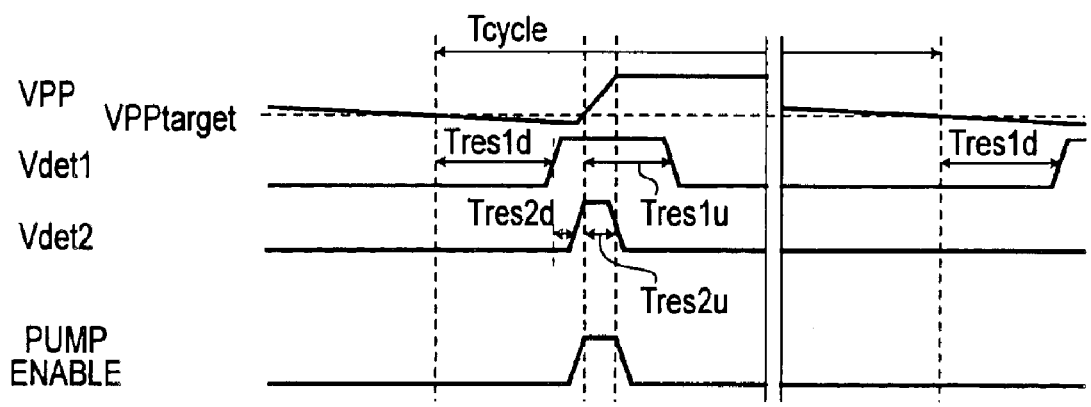
FIG. 6 is a graph showing a signal waveform in a boosting operation of the boosting circuit according to the first embodiment.

An operation of the boosting circuit will be described in detail below with reference to FIG. 6.

During a period in which the internal power supply voltage Vpp serving as an output from the charge pump circuit is higher than the target voltage Vpptarget, both the first and second detection circuits 13 and 15 outputs signals at "Low" level. When the internal power supply voltage Vpp gradually decreases due to, for example, a leakage current of transistors in the semiconductor device and becomes lower than the target value Vpp, the output Vdet1 of the first detection circuit 13 becomes "High" after the response time Tres1$d$ elapsed from that timing.

On the other hand, even though the internal power supply voltage Vpp is lower than the target value Vpptarget, the second detection circuit 15 outputs a signal at "Low" during a period in which the output Vdet1 of the first detection circuit 13 is not at "High", i.e., before the response time Tres1$d$ has elapsed. Therefore, the pump enable signal in the charge pump circuit 11 is still at "Low" level, and the charge pump circuit 11 is not activated.

After the response time Tres1$d$ has elapsed, when the output of the first detection circuit 13 is switched from "Low" to "High", the output Vdet2 of the second detection circuit 15 becomes "High" after elapse of the response time Tres2$d$. In this case, as shown in FIG. 6, the reason why the response time Tres2$d$ of the second detection circuit 15 is shorter than the response time Tres1$d$ of the first detection circuit 13 is because the second detection circuit 15 has the higher response than that of the first detection circuit 13.

When the outputs of both the first and second detection circuits 13 and 15 become "High", the pump enable signal generated in the charge pump circuit 11 becomes "High" to activate the charge pump circuit 11 which then starts the operation. Thus, the internal power supply voltage Vpp begins to increase.

When the internal power supply voltage Vpp increases and exceeds the target voltage Vpptarget, the output Vdet1 of the first detection circuit 13 switched to "Low" after elapse of the response time Tres1$u$, and the output Vdet2 of the second detection circuit 15 switched to "Low" after elapse of the response time Tres2$u$, respectively. In this case, since the second detection circuit 15 has high response, Tres2$u$ is less than Tres1$u$. Therefore, the period in which the pump enable signal is at "High" is shorter than the period in which the output Vdet1 of the first detection circuit 13 is at "High". Hence, the operation period of the charge pump circuit 11 becomes shorter, and an excessive increase of the internal power supply voltage Vpp caused by the charge pump circuit 11 can be suppressed.

In the above example, the enable signal is generated by the AND operation of the outputs Vdet1 and Vdet2 of the first and second detection circuits. However, the output Vdet2 of the second detection circuit may be used directly as the pump enable signal.

In this embodiment, since the DC current of the second detection circuit 15 is set to be higher than that of the first detection circuit 13, a standby current Is is disadvantageously increased. However, the operation period of the charge pump circuit 11 becomes shorter, and therefore the standby current Is can be reduced as a whole.

The standby current Is obtained by the above circuit configuration can be obtained by the following equation $$Is = N \cdot I\text{leak} + (I\text{det}1 + N \cdot I\text{dev}1) + \{(I\text{det}2 + N \cdot I\text{dev}2) \cdot (T\text{res}1d + T\text{res}1u) / T\text{cycle}\}$$

where N denotes an efficiency of the charge pump circuit, and Tcycle denotes an activation efficiency of the charge pump circuit. Ileak denotes a sum of leakage currents of all transistors in the semiconductor device to which the boosting circuit supplies the internal power supply voltage. According to the above equation, controlling the value of {(Tres1$d$+Tres2$u$)/Tcycle} makes it possible to control the standby current Is.

As described above, in the boosting circuit according to this embodiment, two internal power supply detection circuits for outputting signals for activating a charge pump circuit are arranged, the second detection circuit is activated based on an output of the first detection circuit, and the activation/inactivation of the charge pump circuit is controlled based on the output of the second detection circuit. In this manner, since the operation time of the charge pump circuit can be shortened, a current consumption in a standby state can be reduced, and an excessive increase in internal power supply voltage can be suppressed to reduce an amount of ripple included in the internal power supply voltage.

Second Embodiment

Figure 7:
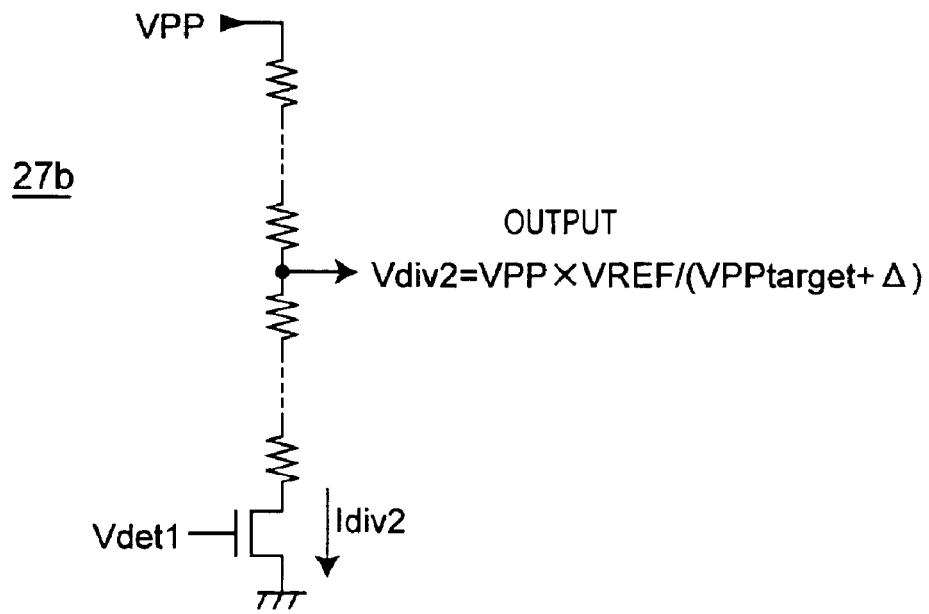
FIG. 7 is a diagram showing the configuration of a comparator circuit of a second detection circuit of a boosting circuit (second embodiment).

Another example of the boosting circuit will be described below. The configuration of this embodiment is basically the same as that of the first embodiment. However, the second embodiment is different from the first embodiment in that the detection level of the second detection circuit is made different from the detection level of the first detection circuit by a predetermined value Δ. More specifically, as shown in FIG. 7, the resistances of the resistors in a voltage dividing circuit 27b of the second detection circuit of this embodiment are set so as to output an output voltage Vdiv2 obtained by the following equation.

$$Vdiv2 = Vpp \cdot VREF/(Vpptarget+\Delta)$$

Figure 8:
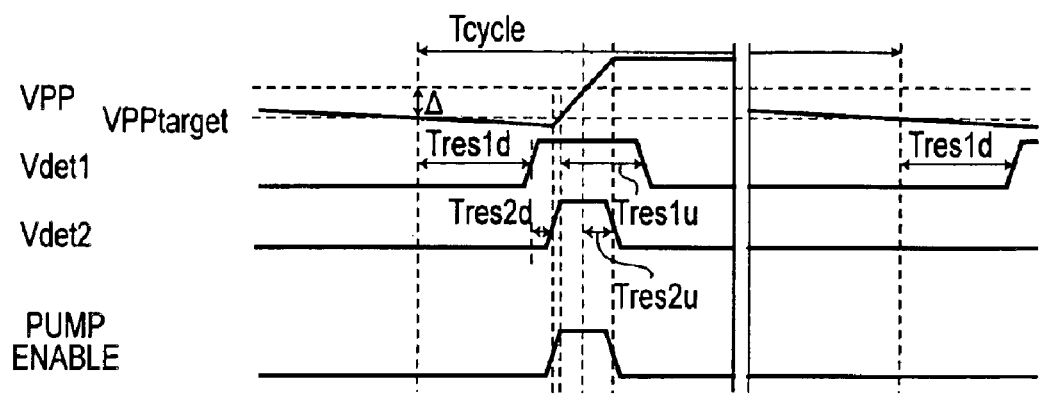
FIG. 8 is a graph showing a signal waveform in a boosting operation of the boosting circuit in the semiconductor device according to the second embodiment of the present invention.

An operation of the boosting circuit will be described below with reference to FIG. 8.

During a period in which the internal power supply voltage Vpp is higher than a target voltage Vpptarget, both the first and second detection circuits 13 and 15 output signals at "Low" level. When the internal power supply voltage Vpp gradually decreases and becomes lower than the target value Vpptarget, the output Vdet1 of the first detection circuit 13 becomes "High" after the response time Tres1d elapses.

On the other hand, even though the internal power supply voltage Vpp is lower than the target value Vpp, the second detection circuit 15 outputs a signal at "Low" during a period in which the first detection circuit 13 does not output a signal at "High", i.e., before the response time Tres1d has elapsed. Therefore, the pump enable signal in the charge pump circuit 11 is still at "Low" level, and the charge pump circuit 11 is not activated.

After the response time Tres1d elapses, when the output Vdet1 of the first detection circuit 13 is switched from "Low" to "High", the output Vdet2 of the second detection circuit 15 becomes "High" after the response time Tres2d has elapses.

When the outputs Vdet1 and Vdet2 of both the first and second detection circuits 13 and 15 become "High", the pump enable signal becomes "High" to activate the charge pump circuit 11 which in tern starts the operation of the charge pump circuit 11. Thus, the internal power supply voltage Vpp begins to increase.

When the internal power supply voltage Vpp increases and then exceeds the voltage (Vpptarget+Δ), the output Vdet2 of the second detection circuit 15 is switched to "Low" after elapse of the response time Tres2u. Thus, the pump enable signal also becomes "Low", the charge pump circuit 11 is inactivated, and the boosting operation of the charge pump circuit 11 is terminated.

As described above, reference values for detection of the first and second detection circuits 13 and 15 are made different from each other by a value Δ, and thus a boosting operation period of the charge pump circuit 11 can be elongated depending on the difference Δ in comparison with the first embodiment. The activation period of the charge pump circuit 11 can be more elongated. The boosting circuit according to this embodiment is especially effected when a low-performance charge pump circuit is used. More specifically, regarding the charge pump circuit with low performance, it takes a long time to boost a voltage after the charge pump circuit is started. Thus the detection level of the second detection circuit is properly set to elongate the activation period of the charge pump circuit, so that a sufficiently boosted voltage can be obtained without increasing an activation ratio (Tres1d+Tres2u)/Tcycle. A power supply voltage having a small amount of ripple can be supplied by a small current consumption.

Third Embodiment

Figure 9:
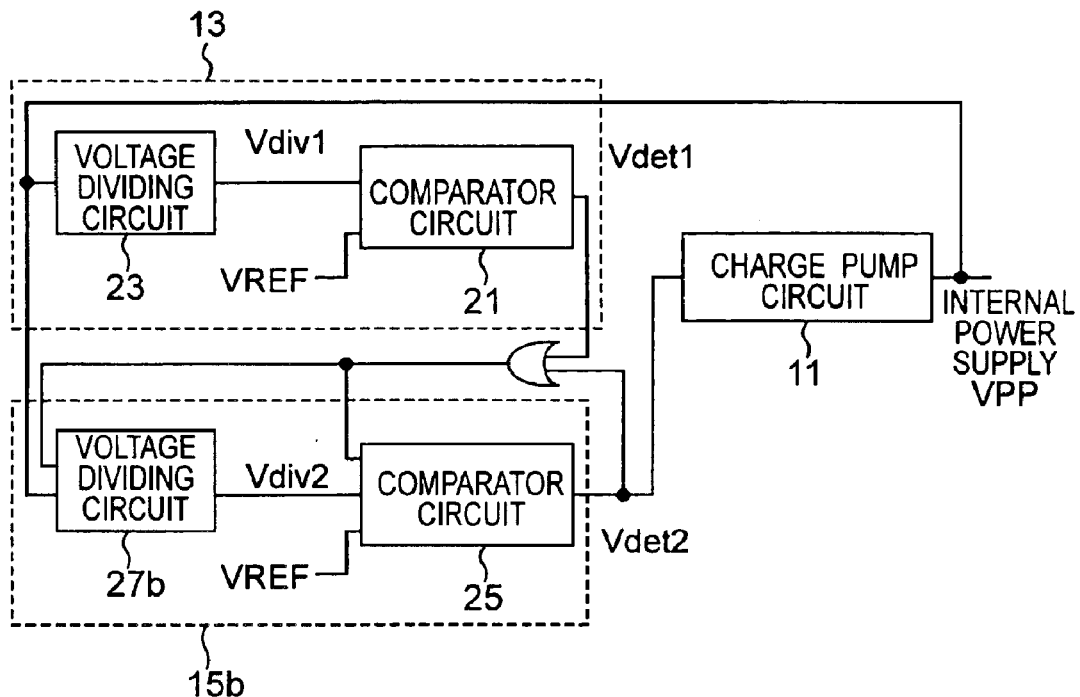
FIG. 9 is a diagram showing the configuration of a boosting circuit in a semiconductor device according to the third embodiment of the present invention.

Still another example of a boosting circuit included in the semiconductor device according to the present invention will be described below. FIG. 9 shows the configuration of the boosting circuit. In the boosting circuit according to this embodiment, the charge pump circuit 11 is activated/inactivated on the basis of only an output of a second detection circuit 15b.

The second detection circuit 15b is the same circuit as described in the second embodiment, including a voltage dividing circuit 27b having a detection level different from that of the first detection circuit. A voltage obtained by performing an OR operation of the output Vdet1 of the first detection circuit 13 and the output Vdet2 of the second detection circuit 15b is input to the second detection circuit 15b. The second detection circuit 15b is activated based on the voltage obtained by the OR operation.

Figure 10:
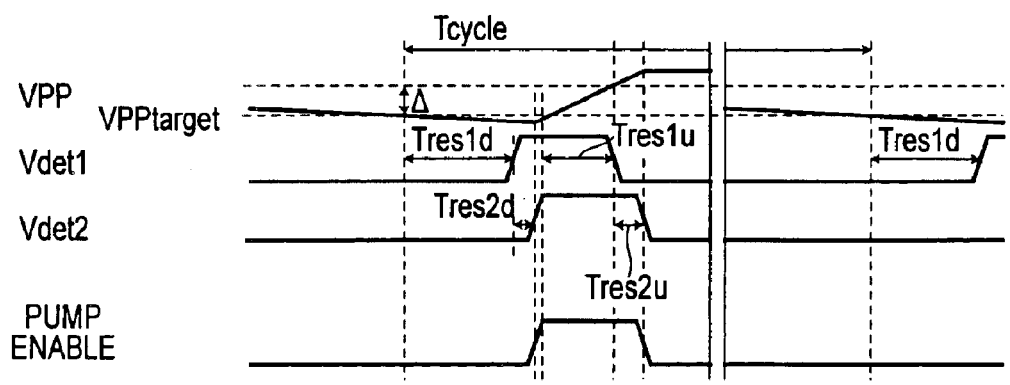
FIG. 10 is a graph showing a signal waveform in a boosting operation of the boosting circuit according to the third embodiment.

FIG. 10 is a diagram showing an operation of the boosting circuit according to this embodiment. The output of the first detection circuit 13 becomes "High" after elapse of the response time Tres1d after an internal power supply voltage Vpp becomes lower than a target voltage Vpptarget. Thereafter, the output becomes "Low" after elapse of the response time Tres1u after the internal power supply voltage Vpp exceeds the target voltage Vpptarget. On the other hand, the output Vdet2 of the second detection circuit 15b becomes "High" after elapse of the response time Tres2d after the internal power supply voltage Vpp is lower than the target voltage Vpptarget and the output Vdet1 of the first detection circuit 13 becomes "High". Thereafter, even though the output Vdet1 of the first detection circuit 13 becomes "Low", the second detection circuit 15b keeps outputting a signal at "High" level until the internal power supply voltage Vpp exceeds the target voltage (Vpptarget+Δ). When the internal power supply voltage Vpp exceeds the target voltage (Vpptarget+Δ) in due course, the output Vdet2 of the second detection circuit 15b becomes "Low" after elapse of the response time Tres2u, and the charge pump circuit 11 is stopped.

As described above, in the boosting circuit according to this embodiment, as in the second embodiment, the detection level of the second detection circuit is properly set to elongate an activation period of the charge pump circuit, so that a sufficiently boosted voltage can be obtained without increasing an activation ratio (Tres1d+Tres2u)/Tcycle. A power supply voltage having a small amount of ripple can be supplied by a small current consumption.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application No. 2003-21758, filed on Jan. 30, 2003, which is expressly incorporated herein by reference in its entirety.

What is claimed is:

1. A semiconductor device comprising a boosting circuit that supplies a power supply voltage during a standby state of the semiconductor device, the boosting circuit including:

a charge pump circuit;

a first detection circuit that detects an output voltage of the charge pump circuit; and a second detection circuit that detects the output voltage of the charge pump circuit, the second detection circuit operating with a DC current greater than that of the first detection circuit and being activated by a detection signal of the first detection circuit, wherein the charge pump circuit is activated based on at least a detection signal of the second detection circuit, and the detection level of the second detection circuit is higher than the detection level of the first detection circuit.

2. A semiconductor device comprising a boosting circuit that supplies a power supply voltage during a standby state of the semiconductor device, the boosting circuit including:

a charge pump circuit;

a first detection circuit that detects an output voltage of the charge pump circuit; and a second detection circuit that detects the output voltage of the charge pump circuit, the second detection circuit operating with a DC current greater than that of the first detection circuit and being activated by a detection signal of the first detection circuit, wherein the charge pump circuit is activated based on at least a detection signal of the second detection circuit, and the charge pump circuit is activated based on a result of AND operation of the detection signals of the first and second detection circuits.

3. The semiconductor device according to claim 1, wherein the second detection circuit generates a signal to inactivate the charge pump circuit based on a status in which the output voltage of the charge pump circuit reaches a predetermined voltage corresponding to the detection level of the second detection circuit.

4. The semiconductor device according to claim 1, wherein a period for which the second detection circuit is active is shorter than a period for which the first detection circuit is active.

5. The semiconductor device according to claim 2, wherein the second detection circuit generates a signal to inactivate the charge pump circuit based on a status in which the output voltage of the charge pump circuit reaches a predetermined voltage corresponding to the detection level of the second detection circuit.

6. The semiconductor device according to claim 2, wherein a period for which the second detection circuit is active is shorter than a period for which the first detection circuit is active.

7. A semiconductor device comprising a boosting circuit for generating a power for the semiconductor device, the boosting circuit including:

a charge pump circuit;

a first detection circuit for detecting that an output voltage of the charge pump circuit reaches a first voltage and in response varying a level of its output signal; and a second detection circuit for detecting that the output voltage of the charge pump circuit reaches a second voltage which is higher than the first voltage and in response varying a level of its output signal, the second detection circuit being activated by the output signal of the first detection circuit or the output signal of the second detection signal, wherein the charge pump circuit is activated based on the output signal of the second detection circuit.

* * * * *